United States Patent
Liu et al.

(10) Patent No.: US 9,558,314 B2
(45) Date of Patent: Jan. 31, 2017

(54) METHOD OF DESIGNING CIRCUIT LAYOUT AND SYSTEM FOR IMPLEMENTING THE SAME

(71) Applicant: TAIWAN SEMICONDUCTOR MANUFACTURING COMPANY, LTD., Hsinchu (TW)

(72) Inventors: Te-Yu Liu, Zhongli (TW); Ke-Ying Su, Taipei (TW); Cheng Hsiao, Hsinchu (TW); Chia-Yi Chen, Hsinchu (TW); Ke-Wei Su, Zhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 28 days.

(21) Appl. No.: 14/580,846

(22) Filed: Dec. 23, 2014

(65) Prior Publication Data

US 2016/0180008 A1 Jun. 23, 2016

(51) Int. Cl.
*G06F 17/50* (2006.01)
(52) U.S. Cl.
CPC ....... *G06F 17/5081* (2013.01); *G06F 17/5036* (2013.01)

(58) Field of Classification Search
USPC ................... 716/111, 113, 115, 122
See application file for complete search history.

(56) References Cited

U.S. PATENT DOCUMENTS

2014/0351779 A1* 11/2014 Ren ............... G06F 17/5068
716/115

* cited by examiner

*Primary Examiner* — Brian Ngo
(74) *Attorney, Agent, or Firm* — Haptman Ham, LLP

(57) ABSTRACT

A method of designing a circuit layout includes calculating a typical value representing performance characteristics for the circuit layout based on a graphic database system (GDS) file. The method further includes calculating an adjustment value based on the GDS file and at least one of a CAP corner vector or a RES corner vector, wherein the CAP corner vector is based on an eigenvector of a parasitic capacitance of the circuit layout, and the RES corner vector is based on an eigenvector of a parasitic resistance of the circuit layout. The method further includes calculating a corner value based on the typical value and the adjustment value. The method further includes modifying the GDS file if performance characteristics of the corner value fail to satisfy performance requirements of the circuit layout.

20 Claims, 5 Drawing Sheets

1

METHOD OF DESIGNING CIRCUIT LAYOUT AND SYSTEM FOR IMPLEMENTING THE SAME

BACKGROUND

Designing circuit layouts includes accounting for parasitic capacitance and parasitic resistance of elements within an interconnect structure. Parasitic capacitance results from conductive features of the interconnect structure unintentionally functioning as a capacitor. Parasitic resistance results from unintentional resistance to current flow at interfaces of various elements. Parasitic capacitance and parasitic resistance impact a performance of the circuit including speed of the circuit, power consumption of the circuit and other operating parameters. Unavoidable production variation causes size and spacing of elements within the interconnect structure to vary from an intended design. These variations in turn change the parasitic capacitance and parasitic resistance of the circuit layout. Average and extreme values of these variations are called process corners and are used in designing the circuit layout.

In some approaches, a techfile is generated for a combination of each process corner of the parasitic capacitance and the parasitic resistance. For example, a typical, i.e., average, parasitic capacitance corner combined with a best, i.e., lowest, parasitic resistance corner; or a worst, i.e., highest, parasitic capacitance combined with a worst parasitic resistance corner; etc. During designing of the circuit layout, a user includes information from this group of techfiles to determine whether the circuit layout will perform a function for which the circuit is designed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
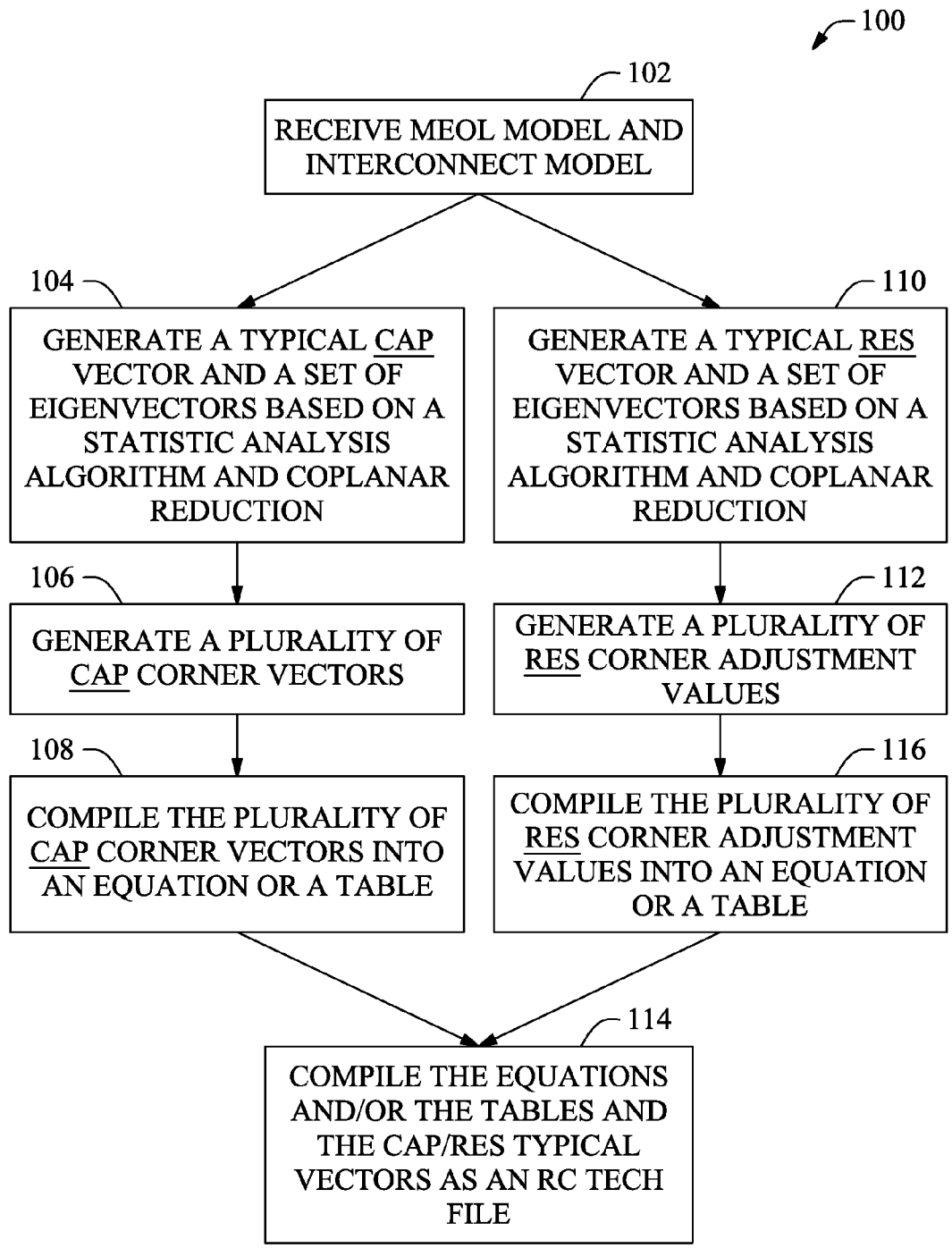
FIG. 1 is a flow chart of a method of generating a unified techfile in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart of a method 100 of generating a unified techfile in accordance with some embodiments. Method 100 begins with operation 102 in which a middle end of line (MEOL) model and an interconnect model are received. The MEOL model is an arrangement of features of a circuit at an interface of a substrate and an interconnect structure. In some embodiments, the MEOL model includes information related to a size and location of a doped region at a surface of the substrate. In some embodiments, the MEOL model includes information related to a size and location of a gate structure of a transistor. In some embodiments, the MEOL model includes information related to a size and location of contacts between features in the substrate, e.g., source and drain terminals, and the interconnect structure. In some embodiments, the MEOL model includes information related to a size and location of a contact conductive line layer, e.g., an M0 layer, or a contact via layer, e.g., a V0 layer.

The interconnect model is an arrangement of features of the circuit used to connect various components of the circuit together. In some embodiments, the interconnect model includes information related to a size and location of conductive lines or vias within the interconnect structure of the circuit. In some embodiments, the interconnect structure includes multiple layers of conductive lines and vias; and the interconnect model includes information related to the size and location of a plurality of the layers of conductive lines and vias.

In some embodiments, at least one of the MEOL model or the interconnect model is received from a circuit designer. In some embodiments, at least one of the MEOL model or the interconnect model is received from a customer. In some embodiments, at least one of the MEOL model or the interconnect model is received from a different component within a same circuit design system. In some embodiments, at least one of the MEOL model or the interconnect model is received from a separate circuit design system.

In operation 104, a typical capacitance (CAP) vector and a set of eigenvectors are generated based on a statistical analysis and a co-planar reduction. The typical CAP vector is an average value of a parasitic capacitance of the MEOL model or the interconnect model based on the statistical analysis and co-planar reduction. The statistical analysis is based on empirical data gathered during production of various circuits using a given production process. The statistical analysis accounts for production variation for the given production process. The co-planar reduction is an estimation process used to reduce an amount of calculations used to determine the typical CAP vector.

Figure 2:
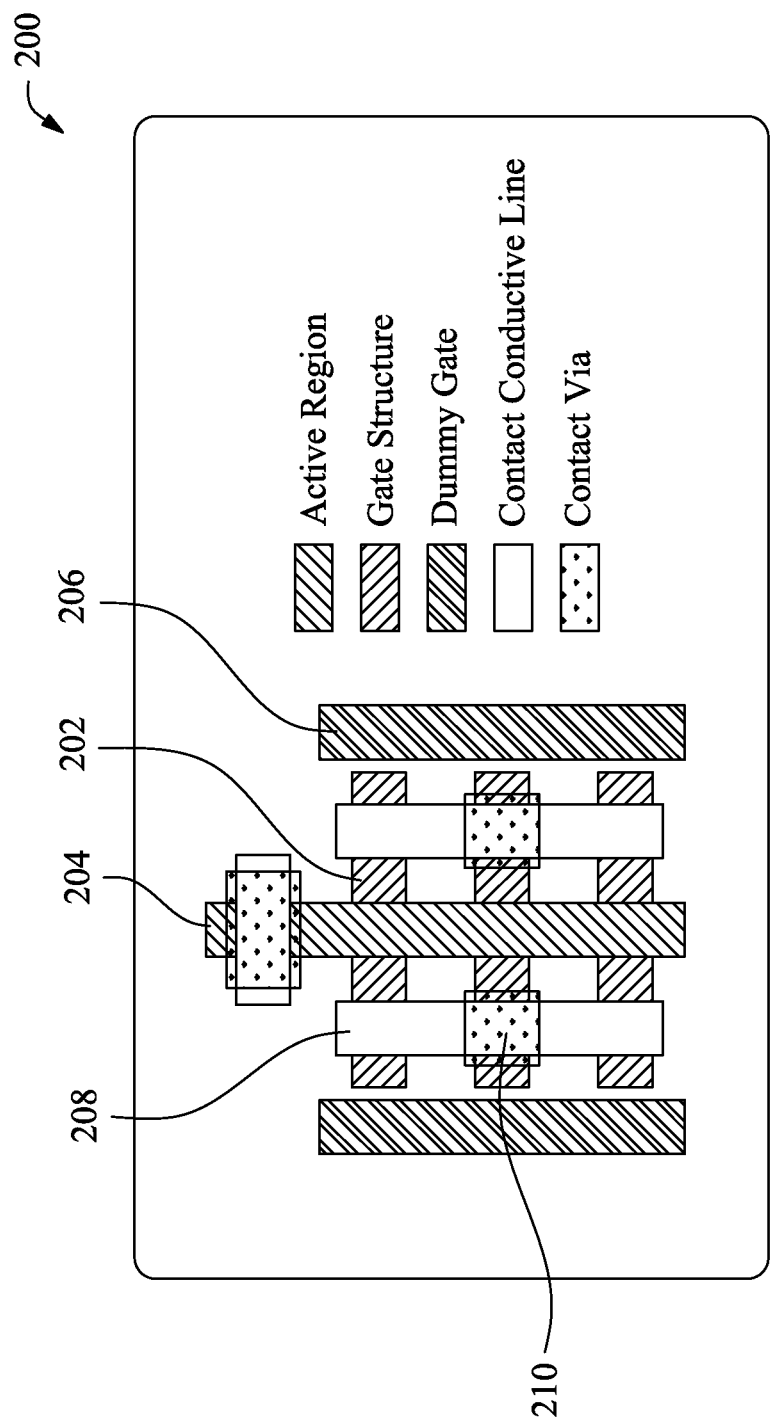
FIG. 2 is a top view of an exemplary circuit structure in accordance with some embodiments.

An example of the co-planar reduction is described with respect to FIG. 2. FIG. 2 is a top view of an exemplary circuit structure 200 in accordance with some embodiments. Circuit structure 200 includes an active region 202 within a substrate. A gate structure 204 is over active region 202. A dummy gate 206 is located outside of active region 202. Contact conductive lines 208 extend along portions of active region 202 on opposite side of gate structure 204. Contact vias 210 electrically connect to contact conductive lines 208 and are configured to electrically connect the contact conductive lines to an interconnect structure, e.g., the interconnect structure of the interconnect model.

In some embodiments, circuit structure 200 is a transistor structure, e.g., a fin field effect transistor (FinFET) structure, a metal oxide semiconductor field effect transistor (MOSFET), or another suitable transistor structure.

Conductive elements located on a same level, i.e., a same distance from a top surface of the substrate, of circuit structure 200 produce a higher degree of parasitic capacitance than conductive elements located on different levels of circuit structure 200. The higher degree of parasitic capacitance results from a smaller distance between the conductive elements. Due to the higher degree of parasitic capacitance of conductive elements on the same level of circuit structure 200, the co-planar reduction process discounts the parasitic capacitance from conductive elements on different levels of the circuit structure. In some embodiments, the co-planar reduction process ignores parasitic capacitance from conductive elements on different levels of circuit structure 200. In some embodiments, the co-planar reduction process assigns a predetermined value to a parasitic capacitance attributed to conductive elements on different levels of circuit structure 200.

For example, the co-planar reduction process applied to circuit structure 200 would account for parasitic capacitance resulting from interactions between contact conductive lines 208, but discount parasitic capacitance resulting from interactions between contact conductive lines 208 and active region 202 or contact vias 210. In another example, the co-planar reduction process applied to circuit structure 200 would account for parasitic capacitance resulting from interactions between active region 202, and discount parasitic capacitance resulting from interactions between active region 202 and gate structure 204 or contact conductive lines 208. In some embodiments where gate structure 204 is on a same level of circuit structure 200 as contact conductive lines 208 or contact vias 210, the co-planar reduction process accounts for parasitic capacitance between gate structure 204 and contact conductive lines 208 or contact vias 210.

By using the co-planar reduction process, a number of calculations used to determine parasitic capacitance within circuit structure 200 is reduced in comparison with approaches which determine parasitic capacitance for all combinations. In the circuit structure 200 there are only five components; however, the number of combinations is still $2^5$. As a number of components within a circuit structure increases, the number of combinations increases in an exponential manner. Using the co-planar reduction process also achieve a high rate of accuracy in comparison with respect to more calculation intensive methods. In some embodiments, an error rate of an estimation using the co-planar reduction process is less than about 3%.

The eigenvectors of the MEOL model and the interconnect model are usable to determine a direction of change in parasitic capacitance of the MEOL model and the interconnect model from a typical process corner as a result of production variation. Directionality of the eigenvectors is given by a positive value or a negative value. The eigenvectors are determined based on the statistical analysis of empirical data of performance characteristics of previously manufactured circuits. In some embodiments, the statistical analysis includes using a least squares method or another regression analysis technique. Once the eigenvectors are determined, a magnitude of the changes for the different process corners is given by an eigenvalue. The eigenvalue is determined using statistical analysis of the empirical data. In some embodiments, the eigenvalue is determined simultaneously with the eigenvectors. In some embodiments, the eigenvalue is determined sequentially with the eigenvectors.

Figure 3:
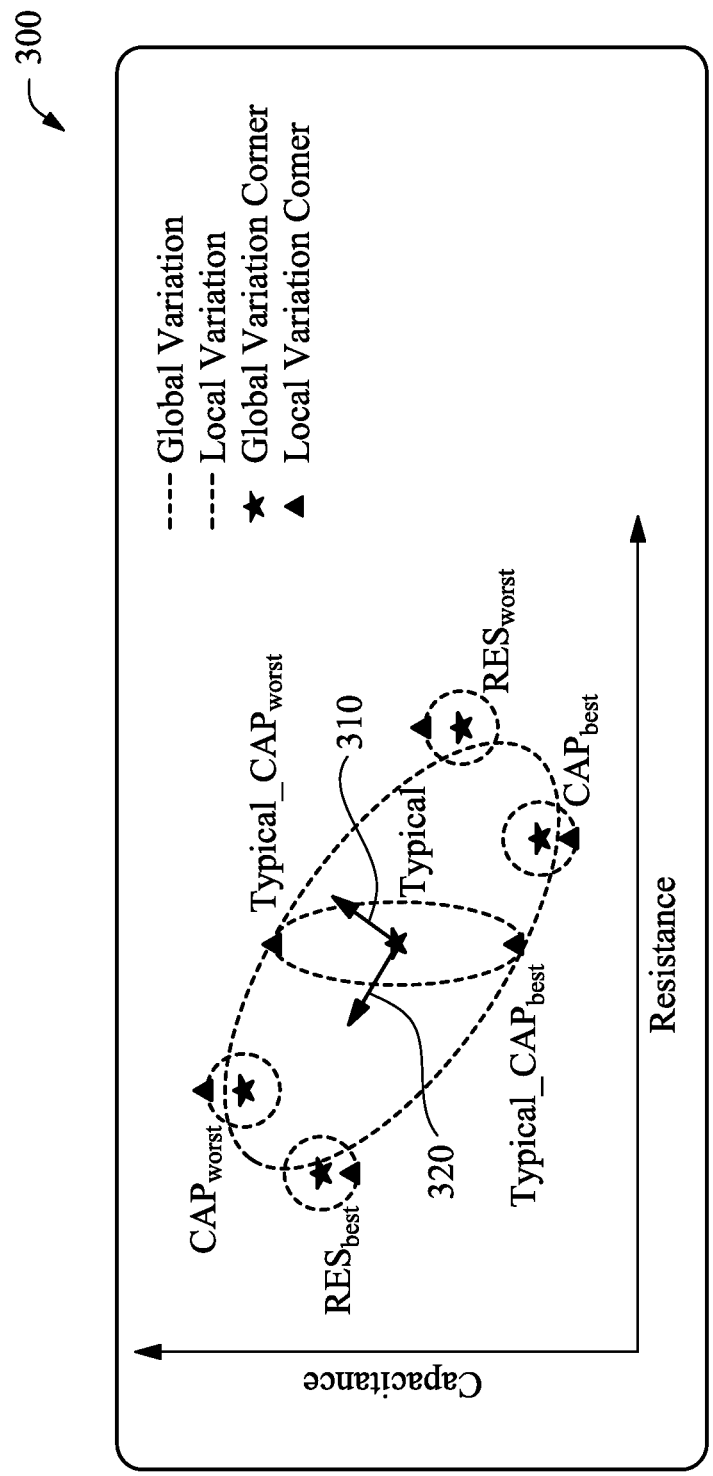
FIG. 3 is a graph of parasitic resistance versus parasitic capacitance for a production process in accordance with some embodiments.

An example of the eigenvector of the MEOL model is provided with respect to FIG. 3. FIG. 3 is a graph 300 of parasitic resistance versus parasitic capacitance for a production process in accordance with some embodiments. Graph 300 includes a typical value which is determined based on statistical analysis of empirical data. A capacitance eigenvector 310 indicates a direction of change of parasitic capacitance due to production variations. A resistance eigenvector 320 indicates a direction of change of parasitic resistance due to production variations. A combination of capacitance eigenvector 310 and resistance eigenvector 320 along with corresponding eigenvalues gives a global variation of parasitic capacitance and parasitic resistance of the MEOL model.

For example, a circuit structure in a process corner having a typical parasitic resistance and a lowest parasitic capacitance will have performance characteristics identified by a Typical_CAPbest point in graph 300. In another example, a circuit structure in a process corner having a best parasitic capacitance and a worst parasitic resistance will have performance characteristics between a CAPbest point in graph 300 and a RESworst point in graph 300. Other performance characteristics of circuit structures resulting from process corners based on combinations of parasitic capacitance and parasitic resistances are apparent from graph 300.

Returning to FIG. 1, method 100 continues with operation 106 in which a plurality of CAP corner vectors are generated. The CAP corner vectors are based on the eigenvectors for the MEOL model and the interconnect model determined in operation 104. The CAP corner vectors have a tail at the typical parasitic capacitance value. In some embodiments, the CAP corner vectors include a vector pointed toward a best parasitic capacitance performance, e.g., CAPbest point in graph 300 (FIG. 3). In some embodiments, the CAP corner vectors include a vector pointed toward a worst parasitic capacitance performance, e.g., CAP worst point in graph 300. In some embodiments, the CAP corner vectors include intermediate process corners, i.e., process corners between the best parasitic capacitance performance and the worst parasitic capacitance performance.

In operation 108, the plurality of CAP corner vectors are compiled into a table or into an equation. The table is usable to look up an adjustment factor for modifying the circuit structure based on a process corner. In some embodiments, the table is generated by a same system as that used to generate the plurality of CAP corner vectors. In some embodiments, the table is generated by a different system from that used to generate the plurality of CAP corner vectors. In some embodiments, the table is updated based on empirical data collected during future manufacturing processes to account for drift within manufacturing tools.

Table 1 is an example of a table usable to look up adjustment factors for capacitance.

TABLE 1

| |
|---|
| $C(A, B) = val1 + alpha1 * s1 + beta1 * s2$ |
| $C(A, C) = val2 + alpha2 * s1 + beta2 * s2$ |
| $C(A, D) = val3 + alpha3 * s1 + beta3 * s2$ |
| $C(B, C) = val4 + alpha4 * s1 + beta4 * s2$ |
| $C(B, D) = val5 + alpha5 * s1 + beta5 * s2$ |
| $C(C, D) = val6 + alpha6 * s1 + beta6 * s2$ |

Using the example of Table 1, a typical corner capacitance value is determined by setting s1 and s2 to zero. A CAPbest value is determined by setting s1 to one and s2 to be zero. A total capacitance for a feature A is determinable by combining the a capacitance for each capacitance which includes feature A, e.g., C(A,B)+C(A,C)+C(A,D). For example, a typical corner capacitance experienced by feature A equals, val1+val2+val3, in some instances; and a CAPbest value experienced by feature A equals val1+alpha1+val2+alpha2+val3+alpha3, in some instances.

The equation is usable to calculate the adjustment factor for modifying the circuit structure based on the process corner. In some embodiments, the equation is generated by a same system as that used to generate the plurality of CAP corner vectors. In some embodiments, the equation is generated by a different system from that used to generate the plurality of CAP corner vectors. In some embodiments, the equation is updated based on empirical data collected during future manufacturing processes to account for drift within manufacturing tools.

In operation 110, a typical resistance (RES) vector and a set of eigenvectors are generated based on a statistical analysis and a co-planar reduction. The typical RES vector is an average value of a parasitic resistance of the MEOL model or the interconnect model based on the statistical analysis and co-planar reduction. Similar to the typical CAP vector, the statistical analysis is based on empirical data gathered during production of various circuits using a given production process. The co-planar reduction reduces an amount of calculations used to determine the typical RES vector.

The co-planar reduction is applied to generating the typical RES vector in a similar manner as the typical CAP vector. In comparison with the typical CAP vector generation, the co-planar reduction for the typical RES vector analyzes parasitic resistance. In some embodiments were the co-planar reduction for the typical RES vector assigns a predetermined value to a parasitic resistance attributed to conductive elements on different levels of the circuit structure, the predetermined value is the same for both the typical RES vector and the typical CAP vector. In some embodiments were the co-planar reduction for the typical RES vector assigns the predetermined value to a parasitic resistance attributed to conductive elements on different levels of the circuit structure, the predetermined value is different for the typical RES vector and the typical CAP vector.

The eigenvectors are generated for the typical RES vector in a similar manner as for the typical CAP vector. In comparison with the typical CAP vector generation, the eigenvector for the typical RES vector analyzes parasitic resistance.

In some embodiments, operation 110 is performed simultaneously with operation 104. In some embodiments, operation 110 is performed sequentially with operation 104. In some embodiments, operation 110 is performed using a same system as that used to perform operation 104. In some embodiments, operation 110 is performed using a different system from that used to perform operation 104.

In operation 112, a plurality of RES corner vectors are generated. The RES corner vectors are based on the eigenvectors for the MEOL model and the interconnect model determined in operation 110. The RES corner vectors have a tail at the typical parasitic resistance value. In some embodiments, the RES corner vectors include a vector pointed toward a best parasitic resistance performance, e.g., RESbest point in graph 300 (FIG. 3). In some embodiments, the RES corner vectors include a vector pointed toward a worst parasitic resistance performance, e.g., RESworst point in graph 300. In some embodiments, the RES corner vectors include intermediate process corners, i.e., process corners between the best parasitic resistance performance and the worst parasitic resistance performance.

In some embodiments, operation 112 is performed simultaneously with operation 106. In some embodiments, operation 112 is performed sequentially with operation 106. In some embodiments, operation 112 is performed using a same system as that used to perform operation 106. In some embodiments, operation 112 is performed using a different system from that used to perform operation 106.

In operation 114, the plurality of RES corner vectors are compiled into a table or into an equation. The table is usable to look-up an adjustment factor for modifying the circuit structure based on a process corner. In some embodiments, the table is generated by a same system as that used to generate the plurality of RES corner vectors. In some embodiments, the table is generated by a different system from that used to generate the plurality of RES corner vectors. In some embodiments, the table is updated based on empirical data collected during future manufacturing processes to account for drift within manufacturing tools.

The equation is usable to calculate the adjustment factor for modifying the circuit structure based on the process corner. In some embodiments, the equation is generated by a same system as that used to generate the plurality of RES corner vectors. In some embodiments, the equation is generated by a different system from that used to generate the plurality of RES corner vectors. In some embodiments, the equation is updated based on empirical data collected during future manufacturing processes to account for drift within manufacturing tools.

In some embodiments, operation 114 is performed simultaneously with operation 108. In some embodiments, operation 114 is performed sequentially with operation 108. In some embodiments, operation 114 is performed using a same system as that used to perform operation 108. In some embodiments, operation 114 is performed using a different system from that used to perform operation 108.

In operation 116, the tables or equations along with the typical CAP vector and the typical RES vector are compiled together into a resistance-capacitance (RC) techfile. The RC techfile includes both the typical values for parasitic resistance and parasitic capacitance as well as adjustment factors based on operations 108 and 114.

In some embodiments, operation 116 is performed using a same system as that used to perform at least one of operation 108 or operation 114. In some embodiments, operation 116 is performed using a different system from that used to perform at least one of operation 108 or operation 114.

In some embodiments, method 100 includes additional operations. In some embodiments, some of the operations of method 100 are combined. In some embodiments, at least one operation of method 100 is separated into multiple operations. In some embodiments, an order of operations in method 100 is changed.

Figure 4:
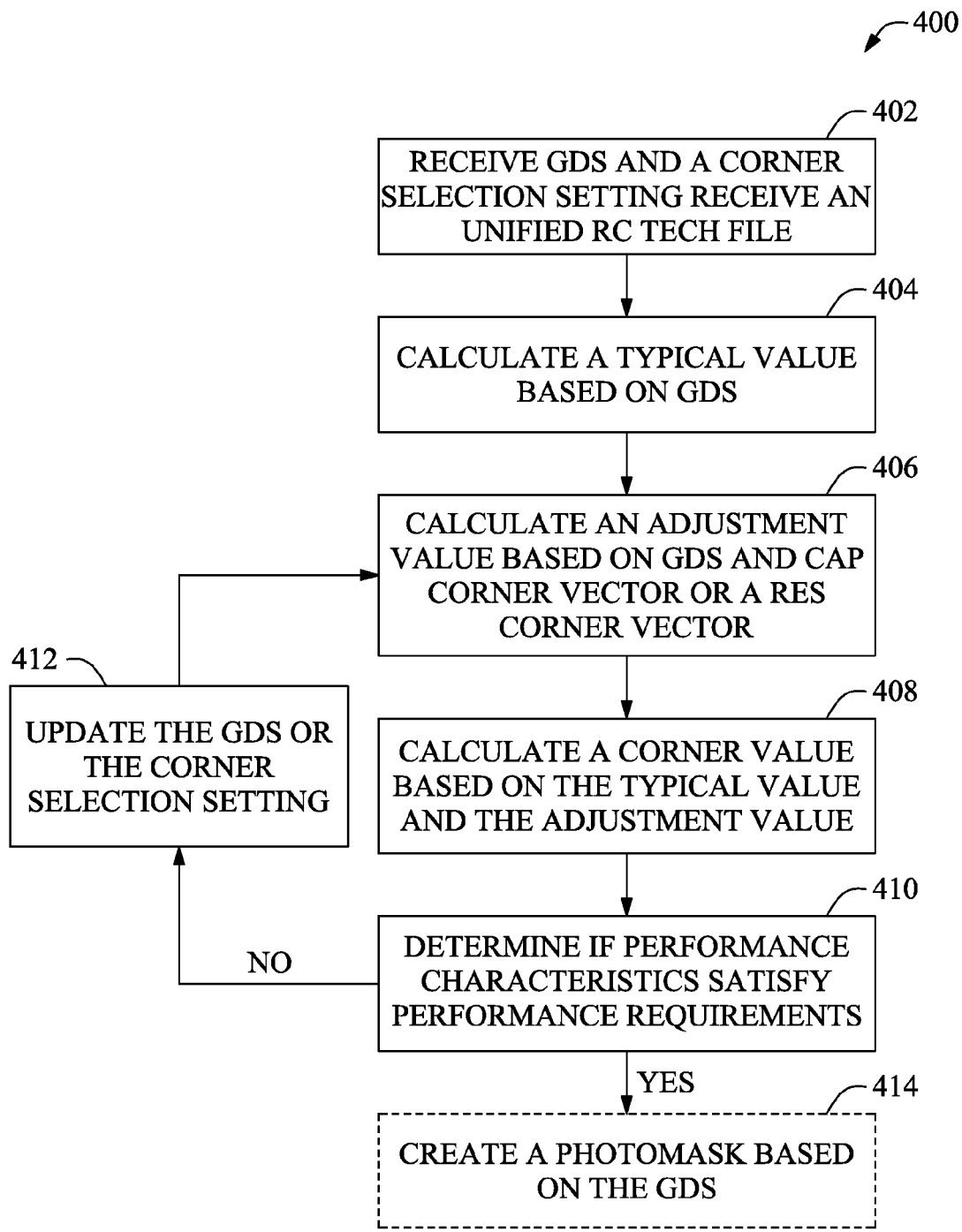
FIG. 4 is a flow chart of a method of designing a circuit layout in accordance with some embodiments.

FIG. 4 is a flow chart of a method 400 of designing a circuit layout in accordance with some embodiments. Method 400 begins with operation 402 in which a graphic database system (GDS) file, a corner selection parameter, and a unified RC techfile is received. The GDS file is a graphical representation of a circuit layout. The corner selection parameter is the process corner used to determine the performance characteristics of the circuit layout. The unified RC techfile is a combined techfile which includes information for typical parasitic capacitance, typical parasitic resistance and adjustment values for different process corners for components of the circuit layout. In some embodiment, the unified RC techfile is generated using method 100 (FIG. 1).

In some embodiments, at least one of the GDS file, the corner selection parameter or the unified RC techfile is received from a circuit designer. In some embodiments, at least one of the GDS file, the corner selection parameter or the unified RC techfile is received from a customer. In some embodiments, at least one of the GDS file, the corner selection parameter or the unified RC techfile is received from a different component within a same circuit design system. In some embodiments, at least one of the GDS file, the corner selection parameter or the unified RC techfile is received from a separate circuit design system.

In operation 404, a typical value is calculated based on the GDS file. In some embodiments, the typical value is also based on a typical vector. The typical vector contains performance characteristics for components of the circuit layout in the GDS file. In some embodiments, the typical vector is retrieved from the unified RC techfile. The typical value includes performance characteristics for the circuit layout at a typical process corner. A non-limiting example of a typical value is the Typical point in graph 300 (FIG. 3). In some embodiments, the typical value is calculated based on a statistical analysis of empirical data, e.g., using operation 104 and operation 110 (FIG. 1). In some embodiments, the typical value is retrieved from the unified RC techfile.

In operation 406, an adjustment value is calculated based on the GDS file and a CAP corner vector or a RES corner vector. The adjustment value is used to determine a difference in the performance characteristic of the typical value and the performance characteristics of the selected corner setting from operation 402. The CAP corner vector represents a direction of change in parasitic capacitance for the circuit layout based on the selected corner setting. The CAP corner vector is based on an eigenvector of the parasitic capacitance for the circuit layout. In some embodiments, the eigenvector of the parasitic capacitance is determined using operation 104 (FIG. 1). The RES corner vector represents a direction of change in parasitic resistance for the circuit layout based on the selected corner setting. The RES corner vector is based on an eigenvector of the parasitic resistance for the circuit layout. In some embodiments, the eigenvector of the parasitic resistance is determined using operation 110.

In some embodiments, the adjustment value is zero when the selected corner setting is typical. In some embodiments, the adjustment value is retrieved from the unified RC techfile. In some embodiments, the adjustment value is retrieved from the unified RC techfile by looking up the adjustment value in a table. In some embodiments, the adjustment value is retrieved from the unified RC techfile by calculating the adjustment value using an equation from the unified RC techfile. In some embodiments, the adjustment value includes an adjustment only to the CAP corner vector, e.g., Typical_CAPworst point in graph 300 (FIG. 3). In some embodiments, the adjustment value includes an adjustment only to the RES corner vector. In some embodiments, the adjustment value includes an adjustment to both the CAP corner vector and the RES corner vector.

In operation 408, a corner value based on the typical value and the adjustment value is calculated. The corner value is determined by combining the typical value with the adjustment value. In some embodiments, the adjustment value is added to the typical value. In some embodiments, the adjustment value is subtracted from the typical value. In some embodiments, the typical value is multiplied by the adjustment value. In some embodiments, the typical value is divided by the adjustment value.

In operation 410, the performance characteristics of the corner value are compared with performance requirements to determine if the performance characteristics satisfy the performance requirements. In some embodiments, the performance requirements are provided by the user. In some embodiments, the performance requirements are provided by the customer. In some embodiments, the performance characteristics of the corner value are stored in the unified RC techfile. In some embodiments, the performance characteristics of the corner value are determined using a simulation tool, e.g., a simulation program with integrated circuit emphasis (SPICE) tool.

If the performance characteristics do not satisfy the performance requirements, as indicated by NO, method 400 continues with operation 412. In operation 412, the GDS file or the corner selection setting is adjusted. In some embodiments, adjusting the GDS file includes changing a size or a location of at least one component of the circuit layout. In some embodiments, the GDS file is adjusted by the user. In some embodiments, the GDS file is adjusted by the customer. In some embodiments, the GDS file is adjusted by the system. In some embodiments, recommendations for adjusting the GDS file are provided by the system.

Adjusting the corner selection setting includes selecting a different corner setting for the circuit layout. In some embodiments, selecting a corner setting which improves performance characteristics of the circuit layout includes requiring that the circuit be formed using a more precise production process to reduce production variations. In some embodiments, the corner selection setting is adjusted by the user. In some embodiments, the corner selection setting is adjusted by the customer. In some embodiments, the corner selection setting is adjusted by the system. In some embodiments, recommendations for adjusting the corner selection setting are provided by the system.

Following operation 412, method continues with operation 406 in which an adjustment value is re-calculated based on the adjusted GDS file or the adjusted corner selection setting.

If the performance characteristics satisfy the performance requirements, as indicated by YES, method 400 continues from operation 410 to optional operation 414. In operation 414, at least one photomask based on the circuit layout in the GDS file is created. Operation 414 is omitted if the photomask is to be formed by a different entity, in some embodiments.

In some embodiments, the at least one photomask is based on received information related to the circuit layout in the GDS file. The photomask is formed by patterning a blank photomask. In some embodiments, the blank photomask includes a low thermal expansion material (LTEM), such as an LTEM glass, silicon, silicon carbide, silicon oxide, titanium oxide, Black Diamond® (a trademark of Applied Materials), or another suitable LTEM. In some embodiments, blank photomask is patterned with reflective material. The reflective material reflects radiation in a lithography waveband used to form the connecting substrate or the functional circuit. In some embodiments, the lithography waveband is an ultraviolet waveband, such as extreme ultraviolet (EUV) or vacuum ultraviolet (VUV), an electron beam (e-beam) or another suitable waveband. In some embodiments, the reflective material includes a multilayer structure. In some embodiments, the reflective material includes alternating layers of molybdenum (Mo) and silicon (Si). In some embodiments, the blank photomask is patterned with absorptive material. The absorptive material absorbs radiation in a lithography waveband used to form the connecting substrate or the functional circuit. The photomask is etched to transfer the pattern of reflective or absorptive material to the photomask.

In some embodiments, method 400 includes additional operations. In some embodiments, some of the operations of method 400 are combined. In some embodiments, at least one operation of method 400 is separated into multiple operations. In some embodiments, an order of operations in method 400 is changed.

Figure 5:
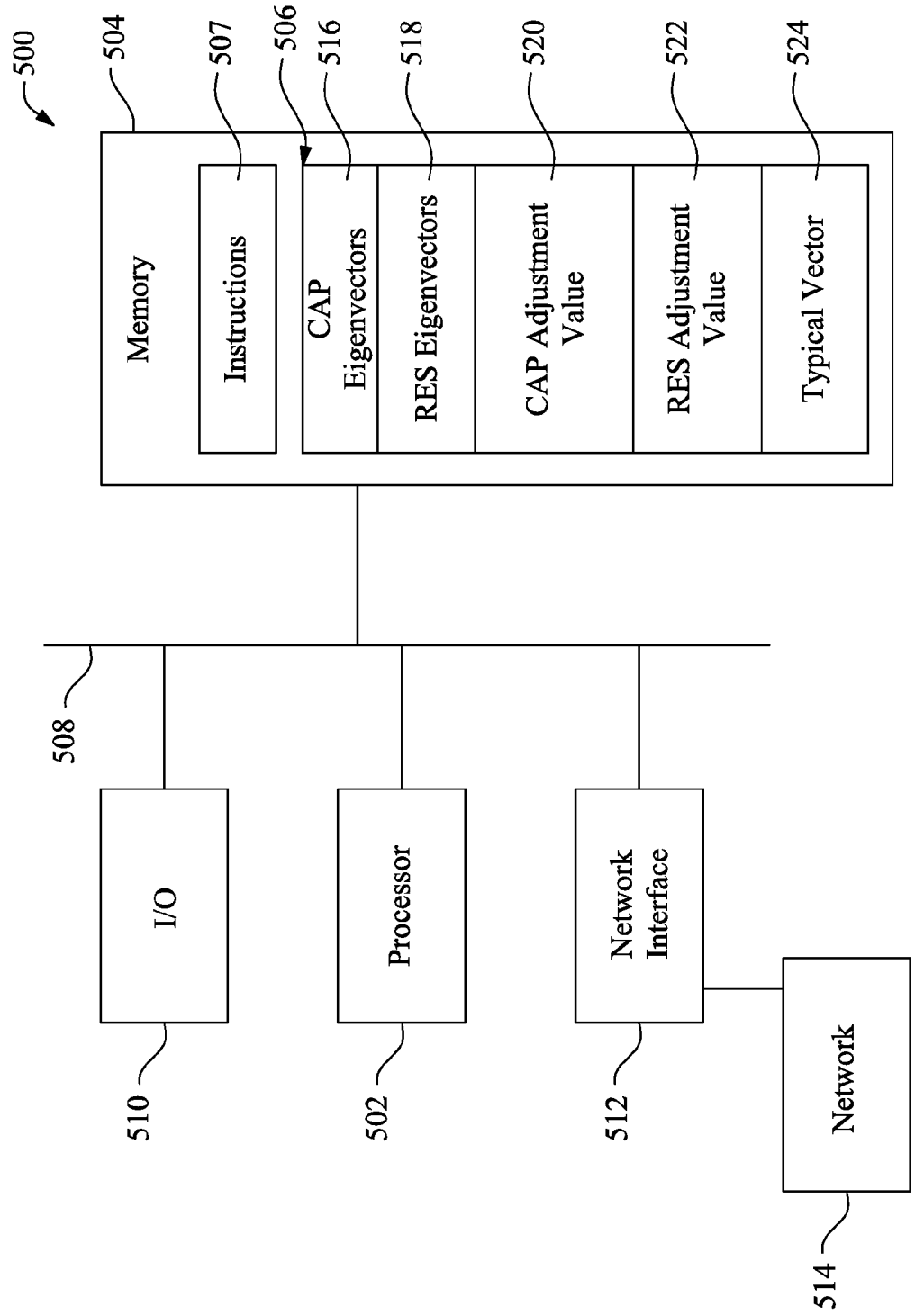
FIG. 5 is a block diagram of a specific purpose system for designing a circuit layout in accordance with some embodiments.

FIG. 5 is a block diagram of a specific purpose system 500 for designing a circuit layout in accordance with some embodiments. System 500 includes a hardware processor 502 and a non-transitory, computer readable storage medium 504 encoded with, i.e., storing, the computer program code 506, i.e., a set of executable instructions. Computer readable storage medium 504 is also encoded with instructions 507 for interfacing with manufacturing machines for producing the memory array. The processor 502 is electrically coupled to the computer readable storage medium 504 via a bus 508. The processor 502 is also electrically coupled to an I/O interface 510 by bus 508. A network interface 512 is also electrically connected to the processor 502 via bus 508. Network interface 512 is connected to a network 514, so that processor 502 and computer readable storage medium 504 are capable of connecting to external elements via network 514. The processor 502 is configured to execute the computer program code 506 encoded in the computer readable storage medium 504 in order to cause system 500 to be usable for performing a portion or all of the operations as described in method 100 or method 400.

In some embodiments, the processor 502 is a central processing unit (CPU), a multi-processor, a distributed processing system, an application specific integrated circuit (ASIC), and/or a suitable processing unit.

In some embodiments, the computer readable storage medium 504 is an electronic, magnetic, optical, electromagnetic, infrared, and/or a semiconductor system (or apparatus or device). For example, the computer readable storage medium 504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the storage medium 504 stores the computer program code 506 configured to cause system 500 to perform method 100 or method 400. In some embodiments, the storage medium 504 also stores information needed for performing a method 100 or 400 as well as information generated during performing the method 100 or 400, such as a CAP eigenvectors parameter 516, a RES eigenvectors parameter 518, a CAP adjustment value parameter 520, a RES adjustment value parameter 522, a typical vector parameter 524 and/or a set of executable instructions to perform the operation of method 100 or 400.

In some embodiments, the storage medium 504 stores instructions 507 for interfacing with manufacturing machines. The instructions 507 enable processor 502 to generate manufacturing instructions readable by the manufacturing machines to effectively implement method 100 or method 400 during a manufacturing process.

System 500 includes I/O interface 510. I/O interface 510 is coupled to external circuitry. In some embodiments, I/O interface 510 includes a keyboard, keypad, mouse, trackball, trackpad, and/or cursor direction keys for communicating information and commands to processor 502.

System 500 also includes network interface 512 coupled to the processor 502. Network interface 512 allows system 500 to communicate with network 514, to which one or more other computer systems are connected. Network interface 512 includes wireless network interfaces such as BLUETOOTH, WIFI, WIMAX, GPRS, or WCDMA; or wired network interface such as ETHERNET, USB, or IEEE-1394. In some embodiments, method 300 or 400 is implemented in two or more systems 500, and information such as memory type, memory array layout, I/O voltage, I/O pin location and charge pump are exchanged between different systems 500 via network 514.

System 500 is configured to receive information related to a circuit layout through I/O interface 510 or network interface 512. In some embodiments, the circuit layout information includes a GDS file. The circuit layout information is transferred to processor 502 via bus 508 to determine CAP eigenvectors. The CAP eigenvectors are then stored in computer readable medium 504 as CAP eigenvectors parameter 516. Processor 502 is also configured to determine RES eigenvectors based on the circuit layout information. The information is stored in computer readable medium 504 as RES eigenvectors parameter 518. System 500 is configured to receive information related to a process corner through I/O interface 510 or network interface 512. Processor 502 is configured to determine a CAP adjustment value based on the process corner information. The information is stored in computer readable medium 504 as CAP adjustment value parameter 520. Processor 502 is configured to determine a RES adjustment value based on the process corner information. The information is stored in computer readable medium 504 as RES adjustment value parameter 522. Processor 502 is configured to determine a typical vector based on the circuit layout information. The information is stored in computer readable medium 504 as typical vector parameter 524.

During operation, system 500 determines CAP adjustment parameter 520 based on CAP eigenvectors parameter 516. System 500 also determines RES adjustment parameter 522 based on RES eigenvectors parameter 518. System 500 also combines CAP adjustment vector parameter 520 and RES adjustment vector parameter 522 with typical vector parameter 524 in order to determine performance characteristics of the received circuit layout information.

In some embodiments, system 500 is also configured to update the circuit layout information or the process corner information in an iterative manner if the determined performance characteristics do not satisfied performance requirements.

One aspect of this description relates to a method of designing a circuit layout. The method includes calculating a typical value representing performance characteristics for the circuit layout based on a graphic database system (GDS) file. The method further includes calculating an adjustment value based on the GDS file and at least one of a CAP corner vector or a RES corner vector, wherein the CAP corner vector is based on an eigenvector of a parasitic capacitance of the circuit layout, and the RES corner vector is based on an eigenvector of a parasitic resistance of the circuit layout. The method further includes calculating a corner value based on the typical value and the adjustment value. The method further includes modifying the GDS file if performance characteristics of the corner value fail to satisfy performance requirements of the circuit layout.

Another aspect of this description relates to a method of designing a circuit layout. The method includes receiving a graphic database system (GDS) file and a corner setting selection. The method further includes calculating a typical value representing performance characteristics for the circuit layout based on the GDS file and the corner setting selection. The method further includes calculating an adjustment value based on the GDS file and at least one of a CAP corner vector or a RES corner vector, wherein the CAP corner vector is selected based on the corner setting selection, and the RES corner vector is selected based on the corner setting selection. The method further includes calculating a corner value based on the typical value and the adjustment value. The method further includes modifying the GDS file or the corner setting selection if performance characteristics of the corner value fail to satisfy performance requirements of the circuit layout.

Still another aspect of this description relates to a system for designing a circuit layout. The system includes a processor; and a non-transitory computer readable medium connected to the processor. The processor is configured to execute instructions stored on the non-transitory computer readable medium for calculating a typical value representing performance characteristics for the circuit layout based on a graphic database system (GDS) file. The processor is further configured to execute instructions for calculating an adjustment value based on the GDS file and at least one of a CAP corner vector or a RES corner vector, wherein the CAP corner vector is based on an eigenvector of a parasitic capacitance of the circuit layout, and the RES corner vector is based on an eigenvector of a parasitic resistance of the circuit layout. The processor is further configured to execute instructions for calculating a corner value based on the typical value and the adjustment value. The processor is further configured to execute instructions for modifying the GDS file if performance characteristics of the corner value fail to satisfy performance requirements of the circuit layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of designing a circuit layout, the method comprising:
   calculating a typical value representing performance characteristics for the circuit layout based on a graphic database system (GDS) file;
   calculating an adjustment value based on the GDS file and at least one of a CAP corner vector or a RES corner vector, wherein the CAP corner vector is based on an eigenvector of a parasitic capacitance of the circuit layout, and the RES corner vector is based on an eigenvector of a parasitic resistance of the circuit layout;
   calculating a corner value based on the typical value and the adjustment value;
   creating at least one photomask based on the GDS file if the performance characteristics of the corner value satisfy the performance requirements of the circuit layout; and
   modifying the GDS file if performance characteristics of the corner value fail to satisfy performance requirements of the circuit layout.

2. The method of claim 1, wherein calculating the adjustment value is based on the CAP corner vector and the RES corner vector.

3. The method of claim 1, further comprising selecting the CAP corner vector from a plurality of CAP corner vectors based on a corner setting selection.

4. The method of claim 3, wherein selecting the CAP corner vector comprises selecting the CAP corner vector from the plurality of CAP corner vectors stored in a unified resistance-capacitance (RC) techfile.

5. The method of claim 1, further comprising selecting the RES corner vector from a plurality of RES corner vectors based on a corner setting selection.

6. The method of claim 5, wherein selecting the RES corner vector comprises selecting the RES corner vector from the plurality of RES corner vectors stored in a unified RC techfile.

7. The method of claim 1, wherein calculating the adjustment value comprises returning the adjustment value as zero if a corner setting selection is typical.

8. The method of claim 1, wherein calculating the adjustment value comprises calculating the adjustment value based on an equation stored in a unified RC techfile.

9. The method of claim 1, further comprising modifying a corner setting selection if performance characteristics of the corner value fail to satisfy performance requirements of the circuit layout.

10. A method of designing a circuit layout, the method comprising:
    receiving a graphic database system (GDS) file and a corner setting selection;
    calculating a typical value representing performance characteristics for the circuit layout based on the GDS file and the corner setting selection;
    calculating an adjustment value based on the GDS file and at least one of a CAP corner vector or a RES corner vector, wherein the CAP corner vector is selected based on the corner setting selection, and the RES corner vector is selected based on the corner setting selection;
    calculating a corner value based on the typical value and the adjustment value;
    creating at least one photomask based on the GDS file if the performance characteristics of the corner value satisfy the performance requirements of the circuit layout; and
    modifying the GDS file or the corner setting selection if performance characteristics of the corner value fail to satisfy performance requirements of the circuit layout.

11. The method of claim 10, wherein calculating the adjustment value comprises calculating the adjustment value based on the CAP corner value which is determined based on an eigenvector of a parasitic capacitance of the circuit layout.

12. The method of claim 10, wherein calculating the adjustment value comprises calculating the adjustment value based on the RES corner value which is determined based on an eigenvector of a parasitic resistance of the circuit layout.

13. The method of claim 10, wherein calculating the adjustment value comprises calculating the adjustment value based on an equation stored in a unified resistance-capacitance (RC) techfile.

14. The method of claim 10, wherein calculating the adjustment value comprises selecting the CAP corner vector from a plurality of CAP corner vectors stored in a unified RC techfile based on the corner setting selection.

15. The method of claim 10, wherein calculating the adjustment value comprises selecting the RES corner vector from a plurality of RES corner vectors stored in a unified RC techfile based on the corner setting selection.

16. A system for designing a circuit layout, the system comprising:
   a processor; and
   a non-transitory computer readable medium connected to the processor, wherein the processor is configured to execute instructions stored on the non-transitory computer readable medium for:
      calculating a typical value representing performance characteristics for the circuit layout based on a graphic database system (GDS) file;
      calculating an adjustment value based on the GDS file and at least one of a CAP corner vector or a RES corner vector, wherein the CAP corner vector is based on an eigenvector of a parasitic capacitance of the circuit layout, and the RES corner vector is based on an eigenvector of a parasitic resistance of the circuit layout;
      calculating a corner value based on the typical value and the adjustment value;
      creating at least one photomask based on the GDS file if the performance characteristics of the corner value satisfy the performance requirements of the circuit layout; and
      modifying the GDS file if performance characteristics of the corner value fail to satisfy performance requirements of the circuit layout.

17. The system of claim 16, further comprising an interface for receiving the GDS file.

18. The system of claim 16, wherein the processor is configured to calculate the adjustment value is based on the CAP corner vector and the RES corner vector.

19. The method of claim 16, wherein the processor is further configured to select the CAP corner vector from a plurality of CAP corner vectors based on a corner setting selection.

20. The system of claim 16, wherein the processor is further configured to select the RES corner vector from a plurality of RES corner vectors based on a corner setting selection.

* * * * *